US012002828B2

United States Patent
Tsao et al.

(10) Patent No.: US 12,002,828 B2
(45) Date of Patent: Jun. 4, 2024

(54) ABSORPTION ENHANCEMENT STRUCTURE TO INCREASE QUANTUM EFFICIENCY OF IMAGE SENSOR

(71) Applicant: Taiwan Semiconductor Manufacturing Company, Ltd., Hsin-Chu (TW)

(72) Inventors: Tsun-Kai Tsao, Tainan (TW); Cheng-Hsien Chou, Tainan (TW); Jiech-Fun Lu, Madou Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/868,996

(22) Filed: Jul. 20, 2022

(65) Prior Publication Data

US 2022/0359595 A1    Nov. 10, 2022

Related U.S. Application Data

(62) Division of application No. 16/848,903, filed on Apr. 15, 2020, now Pat. No. 11,600,647.

(60) Provisional application No. 62/982,191, filed on Feb. 27, 2020.

(51) Int. Cl.
*H01L 27/146* (2006.01)

(52) U.S. Cl.
CPC .. *H01L 27/14621* (2013.01); *H01L 27/14625* (2013.01); *H01L 27/1464* (2013.01); *H01L 27/14601* (2013.01); *H01L 27/14683* (2013.01); *H01L 27/14685* (2013.01)

(58) Field of Classification Search
CPC ........... H01L 27/14601; H01L 27/1464; H01L 27/146; H01L 27/14625
See application file for complete search history.

(56) References Cited

U.S. PATENT DOCUMENTS

| 4,277,793 | A | * | 7/1981 | Webb | H01L 31/02161 257/466 |
| 5,370,747 | A | * | 12/1994 | Noguchi | H01L 31/056 136/258 |
| 6,278,145 | B1 | * | 8/2001 | Kato | H01L 27/14685 257/292 |
| 6,624,049 | B1 | * | 9/2003 | Yamazaki | H01L 21/02557 257/E21.174 |

(Continued)

OTHER PUBLICATIONS

Schneider et al. "Pyramidal Surface Textures for Light Trapping and Antireflection in Perovskite-on-Silicon Tandem Solar Cells." Optics Express, vol. 22, No. S6, published Oct. 20, 2014.

(Continued)

*Primary Examiner* — David A Zarneke
(74) *Attorney, Agent, or Firm* — Eschweiler & Potashnik, LLC

(57) ABSTRACT

Various embodiments of the present disclosure are directed towards an image sensor having a photodetector disposed within a substrate. The substrate has a front-side surface and a back-side surface. An absorption enhancement structure is disposed along the back-side surface of the substrate and overlies the photodetector. The absorption enhancement structure includes a plurality of protrusions that extend outwardly from the back-side surface of the substrate. Each protrusion comprises opposing curved sidewalls.

20 Claims, 10 Drawing Sheets

(56) References Cited

U.S. PATENT DOCUMENTS

| | | | | |
|---|---|---|---|---|
| 7,456,452 B2* | 11/2008 | Wells | .................. | H01L 27/1462 |
| | | | | 257/466 |
| 7,482,532 B2* | 1/2009 | Yi | ........................ | G02B 6/1225 |
| | | | | 136/246 |
| 7,670,862 B2* | 3/2010 | Song | ................. | H01L 31/03529 |
| | | | | 438/57 |
| 7,828,983 B2* | 11/2010 | Weber | ............... | H01L 31/02363 |
| | | | | 438/719 |
| 8,354,286 B2* | 1/2013 | Lee | .................. | H01L 27/14683 |
| | | | | 438/57 |
| 8,753,990 B2* | 6/2014 | Gupta | ............... | H01L 21/02609 |
| | | | | 977/901 |
| 9,496,308 B2* | 11/2016 | Haddad | ............... | H01L 27/1462 |
| 10,163,974 B2 | 12/2018 | Su et al. | | |
| 10,205,037 B2* | 2/2019 | Yamashita | ............ | H01L 31/107 |
| 2014/0242801 A1 | 8/2014 | Desplats et al. | | |
| 2015/0287761 A1 | 10/2015 | Huang et al. | | |
| 2018/0337211 A1 | 11/2018 | Su et al. | | |
| 2018/0359434 A1 | 12/2018 | Tanaka et al. | | |
| 2019/0067346 A1 | 2/2019 | Borthakur | | |
| 2019/0148422 A1 | 5/2019 | Cheng et al. | | |
| 2019/0165026 A1 | 5/2019 | Kuo et al. | | |
| 2021/0265514 A1 | 8/2021 | Liu | | |

OTHER PUBLICATIONS

Honsberg et al. "Surface Texturing." The date of publication is unknown. Retrieved online on Aug. 18, 2020 from https://www.pveducation.org/pvcdrom/design-of-silicon-cells/surface-texturing.
U.S. Appl. No. 16/996,130, filed Aug. 18, 2020.
Notice of Allowance dated Nov. 4, 2022 for U.S. Appl. No. 16/848,903.

* cited by examiner

ABSORPTION ENHANCEMENT STRUCTURE TO INCREASE QUANTUM EFFICIENCY OF IMAGE SENSOR

REFERENCE TO RELATED APPLICATIONS

This application is a Divisional of U.S. application Ser. No. 16/848,903, filed on Apr. 15, 2020, which claims the benefit of U.S. Provisional Application No. 62/982,191, filed on Feb. 27, 2020. The contents of the above-referenced patent applications are hereby incorporated by reference in their entirety.

BACKGROUND

Many modern day electronic devices (e.g., digital cameras, optical imaging devices, etc.) comprise image sensors. Image sensors convert optical images to digital data that may be represented as digital images. An image sensor includes an array of pixel sensors, which are unit devices for the conversion of an optical image into digital data. Some types of pixel sensors include charge-coupled device (CCD) image sensors and complementary metal-oxide-semiconductor (CMOS) image sensors (CIS). Compared to CCD pixel sensors, CIS are favored due to low power consumption, small size, fast data processing, a direct output of data, and low manufacturing cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
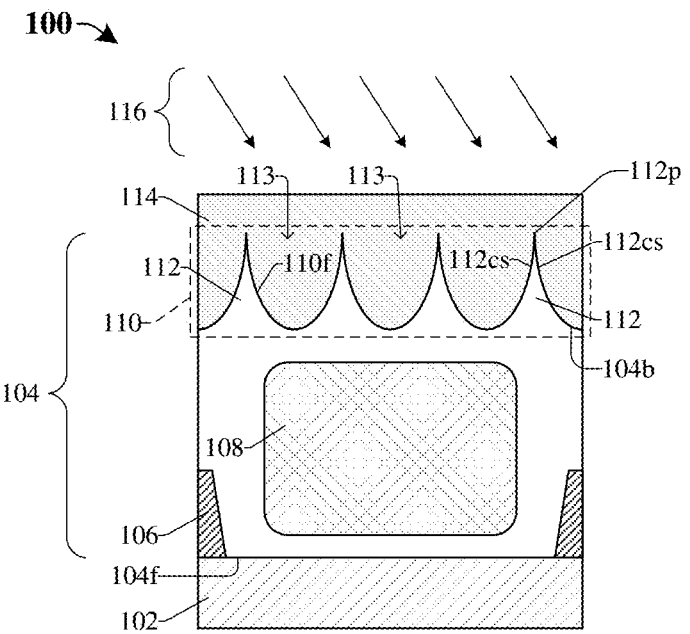
FIG. 1 illustrates a cross-sectional view of some embodiments of an image sensor including an absorption enhancement structure comprising a plurality of protrusions disposed along a surface of a substrate, in which the protrusions comprise curved sidewalls.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

CMOS image sensors (CIS) typically comprise an array of pixel regions, which respectively have a photodetector arranged within a semiconductor substrate. Color filters are arranged over the photodetectors and are configured to filter incident light provided to different photodetectors within the CIS. Upon receiving light, the photodetectors are configured to generate electric signals corresponding to the received light. The electric signals from the photodetectors can be processed by a signal processing unit to determine an image captured by the CIS. Quantum efficiency (QE) is a ratio of the numbers of photons that contribute to an electric signal generated by a photodetector within a pixel region to the number of photons incident on the pixel region. It has been appreciated that the QE of a CIS can be improved with on-chip absorption enhancement structures.

In some embodiments, an absorption enhancement structure is disposed along a back-side surface of the semiconductor substrate, such that the absorption enhancement structure overlies the photodetector. The absorption enhancement structure may comprises a plurality of protrusions that have a triangular shape, such that the protrusions are configured to increase a light receiving surface area for incident electromagnetic radiation disposed upon the back-side of the semiconductor substrate. Generally, the triangular shaped protrusions have substantially straight sidewalls. This, in part, may increase an amount of incident electromagnetic radiation disposed upon the photodetector relative to a back-side having a substantially flat surface, thereby increasing a QE of the CIS. However, due to the substantially straight sidewalls of each protrusion, a light receiving surface area for incident electromagnetic radiation may be decreased, thereby mitigating a QE of the CIS.

Accordingly, some embodiments of the present disclosure are directed towards an image sensor comprising an absorption enhancement structure disposed along a back-side surface of a semiconductor substrate. Further, a photodetector is disposed within the semiconductor substrate and directly underlies the absorption enhancement structure. The absorption enhancement structure comprises a plurality of protrusions disposed along the back-side surface of the semiconductor substrate. Each protrusion in the absorption enhancement structure comprises curved sidewalls. By virtue of the curved sidewalls, a light receiving surface area for incident electromagnetic radiation disposed upon the back-side surface of the semiconductor substrate is increased. For example, an arc length of a curved sidewall of the protrusion is greater than a corresponding length of a substantially straight sidewall of another protrusion, where the protrusion and the another protrusion have a same height. This results in an increase of the light receiving surface area, thereby increasing a QE of the image sensor.

FIG. 1 illustrates a cross-sectional view of some embodiments of an image sensor 100 including an absorption enhancement structure 110 comprising a plurality of protrusions 112 disposed along a surface of a substrate 104.

The image sensor 100 includes an interconnect structure 102 disposed along a front-side 104f of the substrate 104. In some embodiments, the substrate 104 may comprise any semiconductor body (e.g., bulk silicon, epitaxial silicon, another suitable semiconductor material, or any combination of the foregoing) and/or has a first doping type (e.g., p-type doping). The substrate 104 has a first index of refraction (e.g., within a range of about 3.40-3.99, or another suitable value). A photodetector 108 is disposed within the substrate 104 and is configured to convert incident electromagnetic radiation 116 (e.g., photons) into electrical signals (i.e., to generate electron-hole pairs from the incident electromagnetic radiation 116). The photodetector 108 comprises a second doping type (e.g., n-type doping) opposite the first doping type. In some embodiments, the first doping type is n-type and the second doping type is p-type, or vice versa. In further embodiments, the photodetector 108 may be configured as and/or comprises a photodiode or another suitable image sensor device. A first isolation structure 106 is disposed within the substrate 104 and extends from the front-side 104f of the substrate 104 to a point above the front-side 104f. In some embodiments, the first isolation structure 106 may comprise a dielectric material (e.g., silicon dioxide, silicon nitride, silicon carbide, etc.) and/or may be configured as a shallow trench isolation (STI) structure, or another suitable isolation structure.

The absorption enhancement structure 110 is arranged along a back-side 104b of the substrate 104, where the back-side 104b is opposite the front-side 104f of the substrate 104. Further, an upper dielectric structure 114 overlies the absorption enhancement structure 110. The upper dielectric structure 114 has a second index of refraction (e.g., within a range of about 1.40-1.55, or another suitable value). In some embodiments, the first index of refraction is greater than the second index of refraction. The absorption enhancement structure 110 is configured to increase the quantum efficiency (QE) of the underlying photodetector 108 by improving the absorption of photons by the photodetector 108. In some embodiments, the absorption enhancement structure 110 may be configured to increase QE by modifying properties of incident electromagnetic radiation 116 that is transmitted to the photodetector 108. For example, in some embodiments, the substrate 104 is a monocrystalline silicon substrate, and the absorption enhancement structure 110 corresponds to one or more recesses 113 in the back-side 104b of the substrate 104 and corresponding protrusions 112 that engagedly meet the recesses 113, such that the back-side 104b of the substrate 104 is non-planar. The recesses 113 are filled with the upper dielectric structure 114, where the upper dielectric structure 114 comprises a dielectric material (e.g., silicon dioxide) that engagedly meets the protrusions 112. The protrusions 112 are a part of the substrate 104 (e.g., are made of monocrystalline silicon), or alternatively are made from a layer of amorphous or polycrystalline silicon (e.g., formed by chemical vapor deposition (CVD), plasma vapor deposition (PVD), or another suitable deposition process) on the back-side 104b of the substrate 104. In some embodiments, the protrusions 112 are arranged at regularly spaced intervals and/or are arranged in a periodic pattern. An interface 110f at which the recesses 113 and the protrusions 112 meet helps to redirect incident electromagnetic radiation 116 through the substrate 104 and towards the photodetector 108. Thus, the recesses 113 and protrusions 112 establish a topography that increases absorption of incident electromagnetic radiation 116 by the substrate 104 (e.g., by reducing a reflection of light from the non-planar surface). In further embodiments, the recesses 113 each have a concave shape such that the protrusions 112 may each have curved opposing sidewalls. By virtue of the curved opposing sidewalls of the protrusions 112, a light receiving surface area for the incident electromagnetic radiation 116 disposed upon the back-side 104b of the substrate 104 is increased, thereby increasing the QE of the image sensor 100. Further, as illustrated in FIG. 1, each protrusion 112 comprises opposing curved sidewalls 112cs that meet at a protrusion point 112p, where the protrusion point 112p defines a top most point of the protrusion 112.

Figure 2:
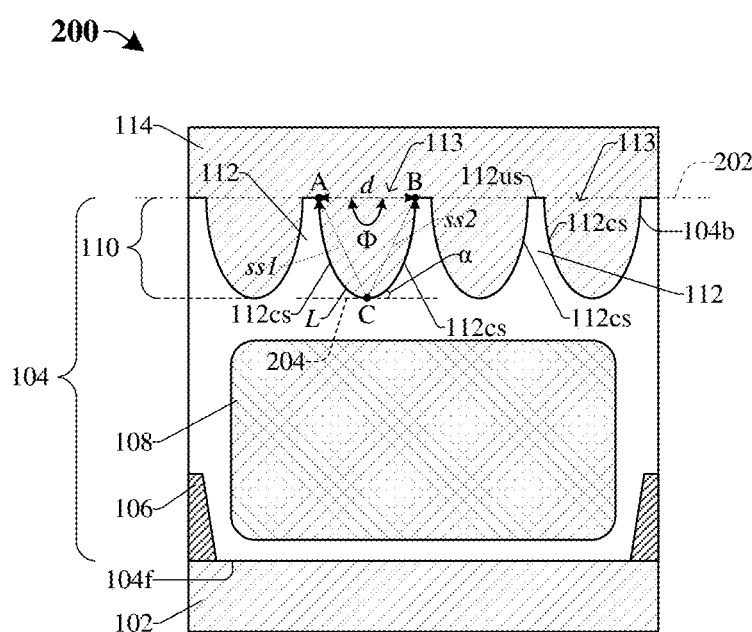
FIG. 2 illustrates a cross-sectional view of some alternative embodiments of the image sensor of FIG. 1, in which each protrusion comprises a substantially flat upper surface.

FIG. 2 illustrates some embodiments of a cross-sectional view of an image sensor 200 corresponding to some alternative embodiments of the image sensor 100 of FIG. 1.

As illustrated in FIG. 2, each protrusion 112 comprises opposing curved sidewalls 112cs that respectively extend from an upper surface 112us. In such embodiments, the upper surface 112us of each protrusion 112 may be substantially flat (e.g., a flat upper surface within a tolerance of a chemical mechanical polishing (CMP) process). For example, in some embodiments, at any point a height of the upper surface 112us of the protrusions 112 varies within a range of −25 Angstroms and +25 Angstroms from a level horizontal line 202. In yet other embodiments, at any point a height of the upper surface 112us of the protrusions 112 varies within a range of approximately +5% and −5% of a thickness of the substrate 104 from the level horizontal line 202.

In addition, the opposing curved sidewalls 112cs of each protrusion 112 are due to each recess 113 comprising arced depressions having substantially arced cross-sections along the back-side 104b of the substrate 104. The arced depressions have a surface area that is proportional to lengths of the arced depressions (e.g., such that a surface area of the protrusions 112 may correspond to lengths of the arced depressions), so that an arced depression that has an interior surface with an arc length spanning an angle of $\Phi$ will have a length L that is approximately equal to $(\Phi/360°)*d*\pi r$. For example, a semi-circular arced depression with a distance d (e.g., a lateral distance between points A and B) and an arc length spanning 180° (i.e., a half circle, where $\Phi=180°$) will have a length L (extending along a portion of the back-side 104b of the substrate 104 between points A and B) that is approximately equal to) $(180°/360°)*d*\pi=(\pi/2)*d$.

In some embodiments, the recesses 113 each being curved causes each protrusion 112 to comprise opposing curved sidewalls 112cs, thereby increasing a length along a cross-section of the back-side 104b of the substrate 104 relative to straight sidewalls. For example, in some embodiments, if each recess 113 comprised opposing slanted sidewalls ss1, ss2 that are straight (as illustrated by the dashed lines extending from point C to point A and from point C to point B), then a length between points A and B, that extends along the opposing slanted sidewalls ss1, ss2, is less than the length L that extends along the arced depression. The increased length L between points A and B increases a light receiving area for incident electromagnetic radiation disposed upon the back-side 104b of the substrate 104, thereby increasing the QE of the image sensor 200.

In some embodiments, a curved sidewall 112cs of the protrusions 112 is defined from point C to point B. In further embodiments, a slope of the curved sidewall 112cs of the protrusions 112 continuously increases while moving along incremental segments of the curved sidewall 112cs from point C to point B. An angle α defined between the curved sidewall 112cs and a lower horizontal line 204 may be, for example, within a range of about 30 to 120 degrees or another suitable value. The lower horizontal line 204 may be parallel to the level horizontal line 202. In yet further embodiments, a slope of the curved sidewall 112cs of each protrusion 112 continuously increases while moving along incremental segments of the curved sidewall 112cs from a bottom point of the corresponding curved sidewall 112cs to the upper surface 112us of the plurality of protrusions 112. Thus, in some embodiments, each curved sidewall 112cs may have the angle α that is within the range of about 30 to 120 degrees or another suitable value.

Figure 3A:
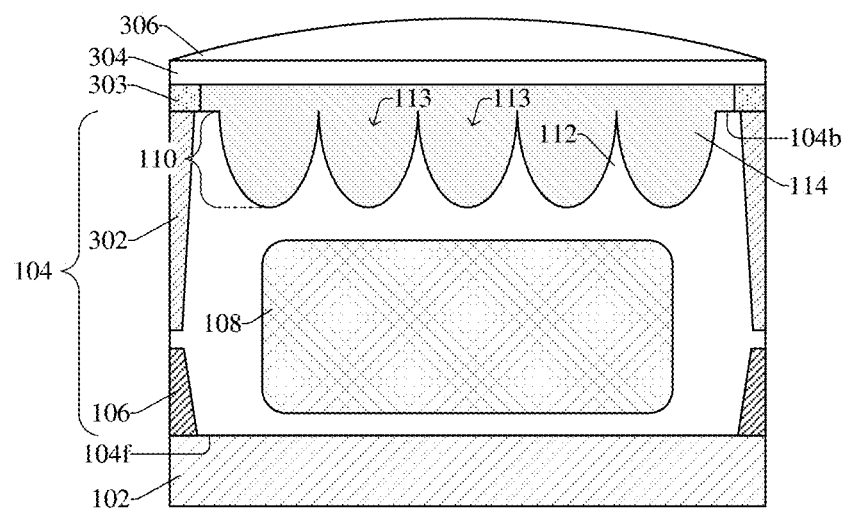
FIGS. 3A-3D illustrate cross-sectional views of some alternative embodiments of the image sensor of FIG. 1, in which a color filter and a micro-lens overlie the absorption enhancement structure.

FIG. 3A illustrates a cross-sectional view of some embodiments of an image sensor 300a including an absorption enhancement structure 110 comprising a plurality of protrusions 112 disposed along a back-side 104b of a substrate 104.

In some embodiments, the image sensor 300a includes the substrate 104 overlying the interconnect structure 102. The image sensor 300a may be configured as a back-side illuminated CMOS image sensor (BSI-CIS) or another suitable image sensor device. In some embodiments, the substrate 104 may, for example, be or comprise any type of semiconductor body, such as monocrystalline silicon, CMOS bulk, silicon-germanium (SeGe), silicon-on-insulator (SOI), or another suitable semiconductor body or material and/or has a first doping type (e.g., p-type doping). A photodetector 108 is disposed within the substrate 104 and may, for example, comprise a second doping type (e.g., n-type doping) that is opposite the first doping type. It will be appreciated that the photodetector 108 and/or the substrate 104 respectively comprising another doping type is also within the scope of the disclosure. In some embodiments, the photodetector 108 may be configured to generate electrical signals from visible light radiation that includes electromagnetic radiation within a range of wavelengths. For example, the range of wavelengths may be within a range of about 400 to 700 nanometers. It will be appreciated that other values for the range of wavelengths are also within the scope of the disclosure.

A first isolation structure 106 is disposed along a front-side 104f of the substrate 104 and laterally encloses the photodetector 108. In some embodiments, the first isolation structure 106 is configured as an STI structure or another suitable isolation structure. In further embodiments, the first isolation structure 106 may, for example, be or comprise silicon nitride, silicon carbide, silicon dioxide, silicon oxynitride, silicon oxycarbide, another suitable dielectric material, or any combination of the foregoing. Further, a second isolation structure 302 is disposed within the substrate 104 and extends from the back-side 104b of the substrate 104 to a point below the back-side 104b. In some embodiments, the second isolation structure 302 may be configured as a deep trench isolation (DTI) structure or another suitable isolation structure. Further, the second isolation structure 302 laterally encloses the photodetector 108. In some embodiments, the second isolation structure 302 may, for example, be or comprise silicon nitride, silicon dioxide, silicon carbide, another suitable material, or any combination of the foregoing. In yet further embodiments, the second isolation structure 302 may continuously extend from the back-side 104b of the substrate 104 to an upper surface of the first isolation structure 106 (not shown). The first and second isolation structures 106, 302 are configured to electrically isolate the photodetector 108 from other semiconductor devices (not shown) disposed along and/or within the substrate 104, other photodetectors (not shown) disposed within the substrate 104, and/or other doped regions (not shown) disposed within the substrate 104.

An absorption enhancement structure 110 is arranged along the back-side 104b of the substrate 104 and comprises a plurality of protrusions 112 that engagedly meet a plurality of recesses 113. Further, an upper dielectric structure 114 overlies the absorption enhancement structure 110, such that the recesses 113 are filled with dielectric material from the upper dielectric structure 114. By virtue of the plurality of protrusions 112 each comprising curved sidewalls, a light receiving surface area for incident electromagnetic radiation disposed upon the back-side 104b of the substrate 104 is increased, thereby increasing a QE of the image sensor 300a. In some embodiments, the upper dielectric structure 114 may, for example, be or comprise an oxide, such as silicon dioxide, another oxide, another suitable dielectric material, or any combination of the foregoing.

A grid structure 303 overlies the back-side 104b of the substrate 104. In some embodiments, the grid structure 303 may, for example, be or comprise a dielectric grid structure, a metal grid structure, another suitable grid structure, or any combination of the foregoing. For example, the grid structure 303 may be or comprise a dielectric grid structure configured to achieve total internal reflection (TIR) with the adjacent upper dielectric structure 114, thereby directing incident electromagnetic radiation towards the underlying photodetector 108. This, in turn, further increases the QE of the image sensor 300a. In such embodiments, the grid structure 303 may, for example, be or comprise an oxide, such as silicon oxynitride, another suitable dielectric material, or any combination of the foregoing. In yet further example, the grid structure 303 may be or comprise a metal grid structure that is configured to reflect incident electromagnetic radiation from its sidewalls towards the underlying photodetector 108. In such embodiments, the grid structure 303 may, for example, be or comprise tungsten, another suitable metal material, or any combination of the foregoing. In yet further embodiments, the grid structure 303 may, for example, be or comprise tungsten and silicon oxynitride such that the grid structure 303 comprises the dielectric grid structure and the metal grid structure.

Further, a color filter 304 is disposed over the absorption enhancement structure 110 and is configured to transmit specific wavelengths of incident electromagnetic radiation within a first range of wavelengths while blocking incident electromagnetic radiation within a second range of wavelengths different from the first range of wavelengths. For example, the color filter 304 may be configured to transmit a first color (e.g., green light) towards the photodetector 108, while blocking other colors. It will be appreciated that the color filter 304 transmitting other colors and/or incident electromagnetic radiation is within the scope of the disclosure. A micro-lens 306 overlies the color filter 304 and comprises a convex upper surface that is configured to direct incident electromagnetic radiation towards the photodetector 108, thereby increasing the QE of the image sensor 300a.

Figure 3B:
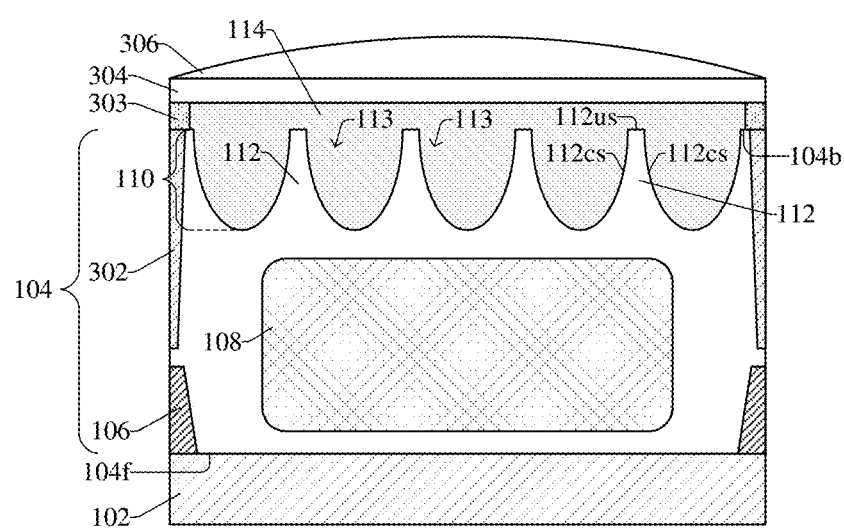

FIG. 3B illustrates a cross-sectional view of some embodiments of an image sensor 300b according to alternative embodiments of the image sensor 300a of FIG. 3A, where each protrusion 112 comprises opposing curved sidewalls 112cs that extend from an upper surface 112us. In some embodiments, the upper surface 112us of each protrusion 112 is substantially flat.

Figure 3C:
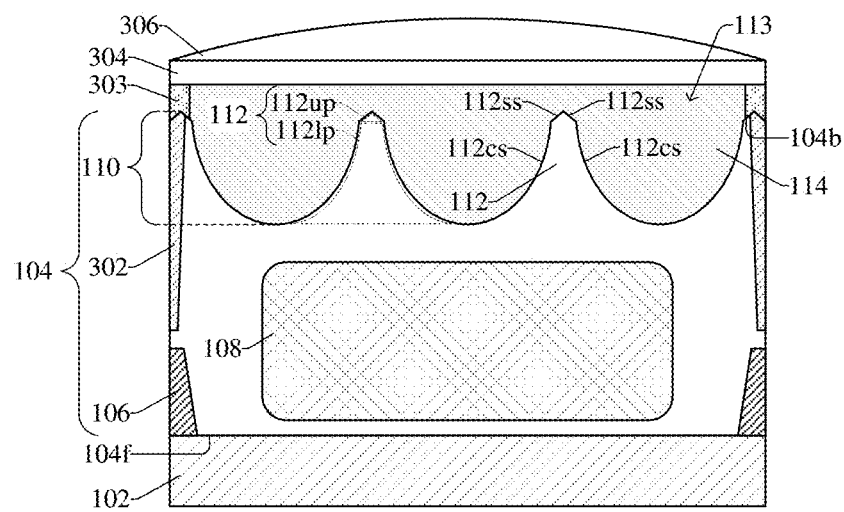

FIG. 3C illustrates a cross-sectional view of some embodiments of an image sensor 300c according to alternative embodiments of the image sensor 300a of FIG. 3A, in which each protrusion 112 comprises an upper portion 112up overlying a lower portion 112lp. In some embodiments, the upper portion 112up of each protrusion 112 has a rectangular shape or another suitable shape. Thus, each protrusion 112 may have opposing slanted sidewalls 112ss that overlie opposing curved sidewalls 112cs. By virtue of the opposing slanted sidewalls 112ss of the upper portion 112up, a light receiving surface area for incident electromagnetic radiation disposed upon the substrate 104 is increased, thereby increasing the QE of the image sensor 300c.

Figure 3D:
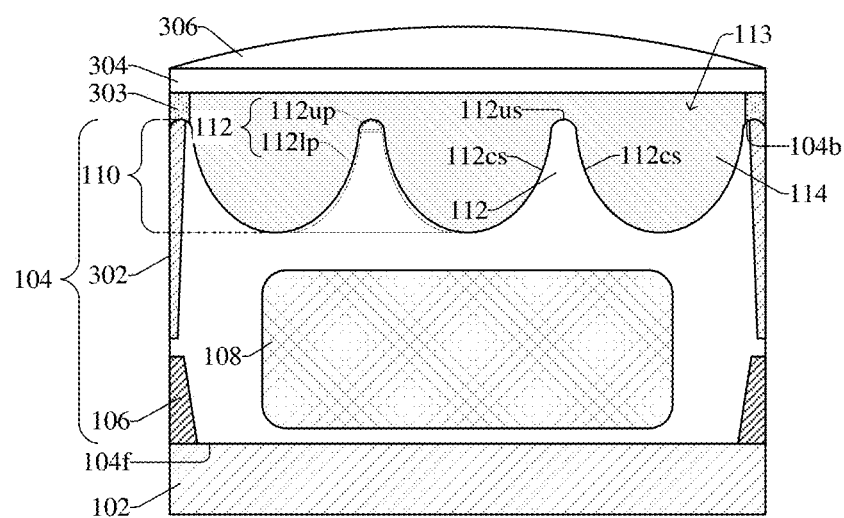

FIG. 3D illustrates a cross-sectional view of some embodiments of an image sensor 300d according to alternative embodiments of the image sensor 300a of FIG. 3A, in which each protrusion 112 comprises an upper portion 112up overlying a lower portion 112lp. In some embodiments, the upper portion of each protrusion 112 has a semicircular shape or another suitable shape. Thus, an upper surface 112us of each protrusion 112 may be curved, convex, or another suitable shape, thereby increasing a light receiving surface area for incident electromagnetic radiation disposed upon the substrate 104 and increasing the QE of the image sensor 300d.

Figure 4A:
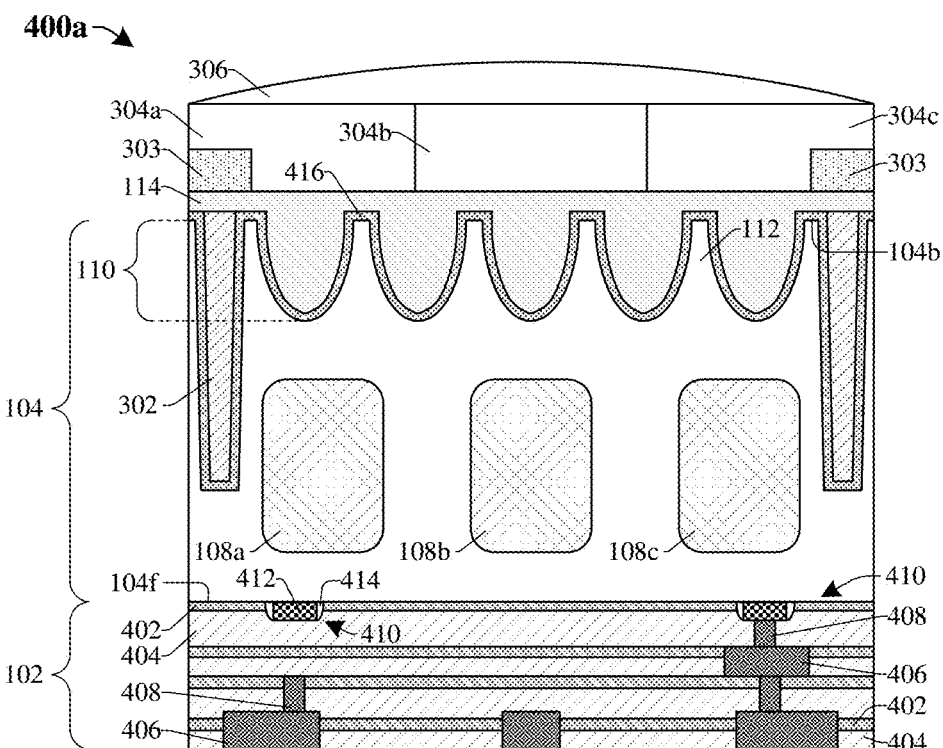
FIGS. 4A-4C illustrate some embodiments of cross-sectional views of an integrated chip including an absorption enhancement structure comprising a plurality of protrusions disposed along a surface of a substrate, in which the protrusions comprise curved sidewalls.

FIG. 4A illustrates a cross-sectional view of some embodiments of an integrated chip 400a including a substrate 104 overlying an interconnect structure 102.

A plurality of semiconductor devices 410 are disposed within the interconnect structure 102 and along a front-side 104f of the substrate 104. In some embodiments, the semiconductor devices 410 may be configured as pixel devices that may output and/or process an electrical signal generated by photodetectors 108a-c. The semiconductor devices 410 may, for example, be configured as transfer transistors, source-follower transistors, row-select transistors, and/or reset transistors. It will be appreciated that the semiconductor devices 410 being configured as other semiconductor devices is also within the scope of the disclosure. In further embodiments, the semiconductor devices 410 may each comprise a gate structure 412 disposed along the front-side 104f of the substrate 104, and a sidewall spacer structure 414 disposed along sidewalls of the gate structure 412. In yet further embodiments, the gate structure 412 includes a gate dielectric layer and a gate electrode, where the gate dielectric layer is disposed between the substrate 104 and the gate electrode.

The interconnect structure 102 may, for example, include a plurality of dielectric layers 402, a plurality of inter-level dielectric (ILD) layers 404, a plurality of conductive wires 406, and a plurality of conductive vias 408. In some embodiments, the dielectric layers 402 may be configured as etch stop layers and/or may, for example, be or comprise silicon nitride, silicon carbide, silicon oxynitride, silicon oxycarbide, another suitable dielectric material, or any combination of the foregoing. In further embodiments, the ILD layers 404 may, for example, be or comprise an oxide, such as silicon dioxide, a fluorosilicate glass, a phosphate glass (e.g., borophosphate silicate glass), another suitable dielectric material, or any combination of the foregoing. The conductive wires and vias 406, 408 are disposed within the ILD layers 404 and the dielectric layers 402, and are configured to electrically couple devices disposed within the integrated chip 400a to one another and/or to another integrated chip (not shown). In some embodiments, the conductive wires and/or vias 406, 408 may, for example, respectively be or comprise copper, aluminum, titanium nitride, tantalum nitride, tungsten, another suitable conductive material, or any combination of the foregoing. It will be appreciated that the conductive wires and/or vias 406, 408 comprising other suitable materials is also within the scope of the disclosure.

In some embodiments, the substrate 104 may be any semiconductor body (e.g., bulk silicon, another suitable semiconductor material, or the like) and/or has a first doping type (e.g., p-type doping). The photodetectors 108a-c are disposed within the substrate 104 and respectively have a second doping type (e.g., n-type doping) that is opposite to the first doping type. It will be appreciated that the photodetectors 108a-c and/or the substrate 104 comprising another doping type is also within the scope of the disclosure. An absorption enhancement structure 110 is arranged along the back-side 104b of the substrate 104 and comprises a plurality of protrusions 112 each with opposing curved sidewalls. Thus, the absorption enhancement structure 110 is configured to increase a light receiving surface area for incident electromagnetic radiation disposed upon the back-side 104b of the substrate 104, thereby increasing the QE of the integrated chip 400a.

In some embodiments, a second isolation structure 302 may laterally enclose the photodetectors 108a-c and extends from the back-side 104b of the substrate 104 to a point below the back-side 104b. The second isolation structure 302 may be configured as a DTI structure, a back-side deep trench isolation (BDTI) structure, or another suitable isolation structure. In some embodiments, the second isolation structure 302 may, for example, be or comprise a dielectric material such as silicon nitride, silicon carbide, silicon dioxide, silicon oxycarbide, silicon oxynitride, another suitable dielectric material, a metal material such as copper, aluminum, tungsten, another suitable metal material, or any combination of the foregoing. In further embodiments, a passivation layer 416 is disposed along the back-side 104b of the substrate 104 and is disposed between the second isolation structure 302 and the substrate 104. Thus, the passivation layer 416 may continuously laterally extend along the protrusions 112 of the absorption enhancement structure 110. In some embodiments, the passivation layer 416 may, for example, be or comprise a high-k dielectric material (e.g., a dielectric material with a dielectric constant greater than 3.9), hafnium oxide (e.g., $HfO_2$), aluminum oxide (e.g., $Al_2O_3$), tantalum oxide (e.g., $Ta_2O_5$), another suitable dielectric material, or any combination of the foregoing. In addition, the upper dielectric structure 114 overlies the passivation layer 416 and the second isolation structure 302. The grid structure 303 overlies the upper dielectric structure 114 and the second isolation structure 302.

A plurality of color filters 304a-c overlie the upper dielectric structure 114. The color filters 304a-c (e.g., a red color filter, a blue color filter, a green color filter, etc.) are respectively configured to pass electromagnetic radiation within a first range of frequencies while blocking electromagnetic radiation within a second range of frequencies different from the first range of frequencies. For example, in some embodiments, a first color filter 304a may be configured as a green color filter while an adjacent second color filter 304b may be configured as a red color filter. In addition, a micro-lens 306 overlies the color filters 304a-c and is configured to direct incident electromagnetic radiation towards the photodetectors 108a-c, thereby further increasing the QE of the integrated chip 400a.

Figure 4B:
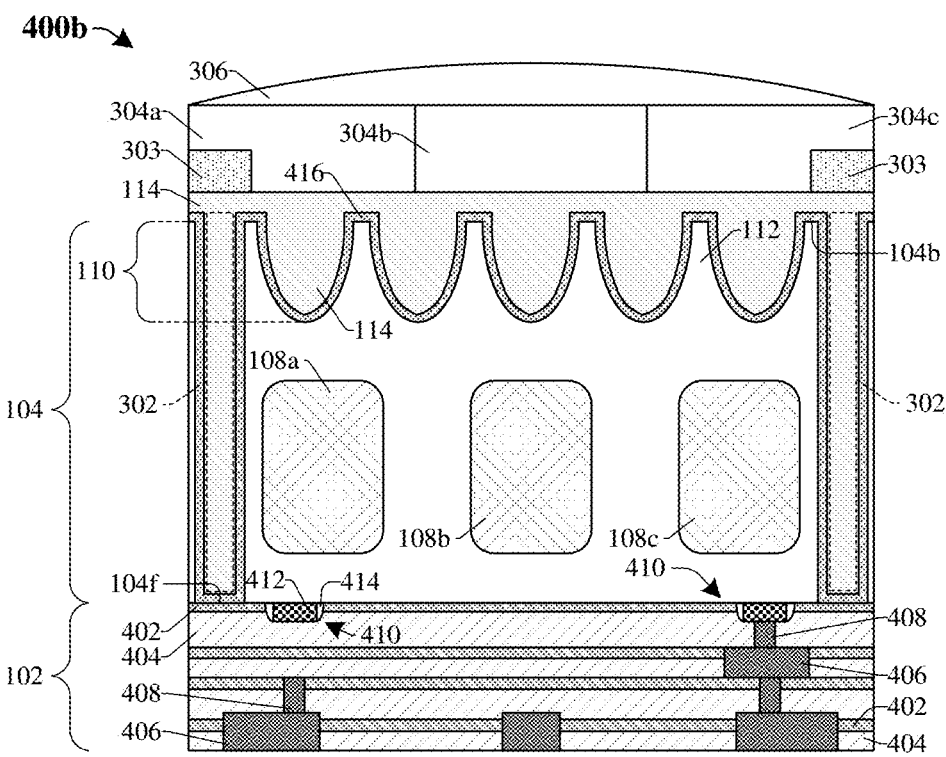

FIG. 4B illustrates a cross-sectional view of some embodiments of an integrated chip 400b corresponding to some alternative embodiments of the integrated chip 400a of FIG. 4A, in which the second isolation structure 302 comprises a same material as the upper dielectric structure 114. In some embodiments, the passivation layer 416 continuously extends from above the back-side 104b of the substrate 104 to a point that is aligned with the front-side 104f of the substrate 104.

Figure 4C:
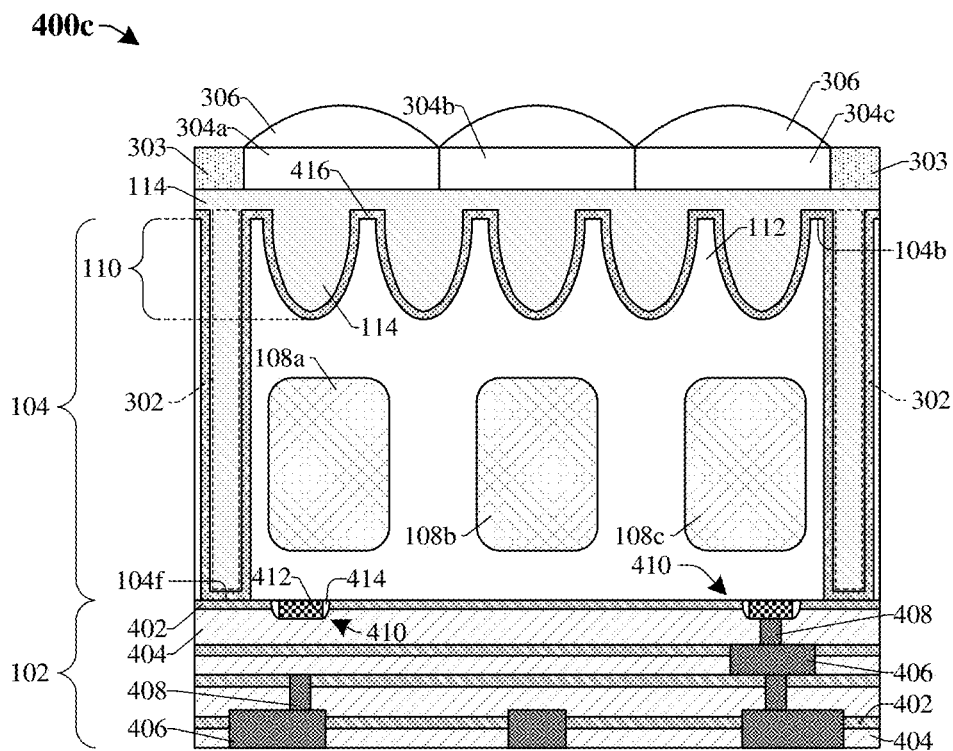

FIG. 4C illustrates a cross-sectional view of some embodiments of an integrated chip 400c corresponding to some alternative embodiments of the integrated chip 400b of FIG. 4B, in which the color filters 304a-c are spaced laterally between sidewalls of the grid structure 303. In some embodiments, a micro-lens 306 directly overlies each photodetector 108a-c.

In some embodiments, it will be appreciated that although the protrusions 112 of the integrated chips 400a-c of FIGS. 4A-C are illustrated and/or described as the protrusions 112 in FIG. 3B, the protrusions 112 of FIGS. 4A-C may be configured as the protrusions 112 of FIG. 3A, 3C, or 3D.

FIGS. 5-12 illustrate cross-sectional views 500-1200 of some embodiments of a method for forming an image sensor comprising an absorption enhancement structure including a plurality of protrusions disposed along a surface of a substrate according to the present disclosure. Although the cross-sectional views 500-1200 shown in FIGS. 5-12 are described with reference to a method, it will be appreciated that the structures shown in FIGS. 5-12 are not limited to the method but rather may stand alone separate of the method. Furthermore, although FIGS. 5-12 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 5:
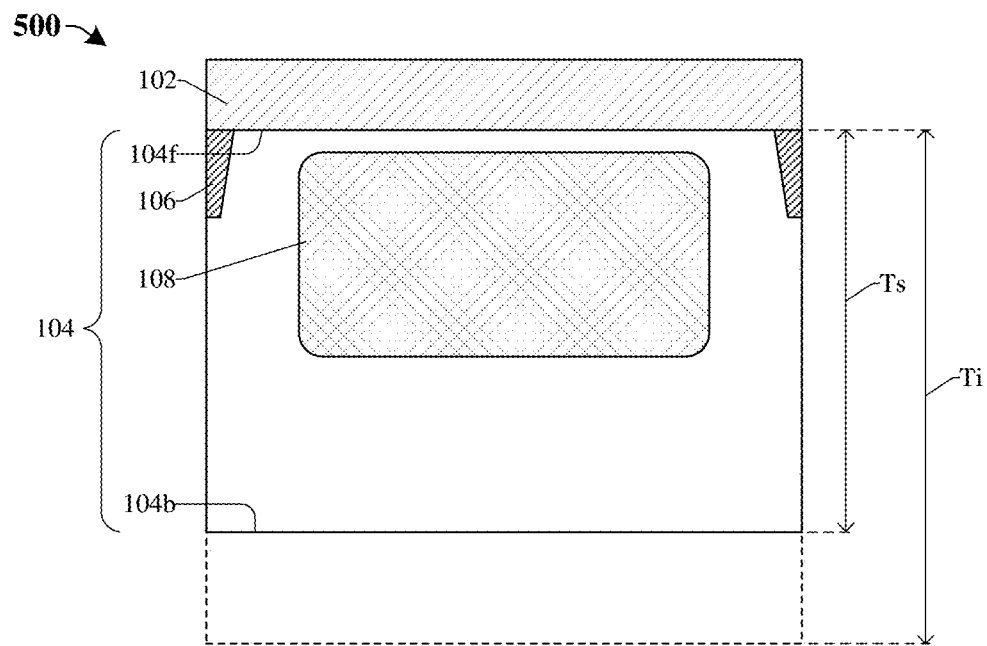
FIGS. 5-12 illustrate cross-sectional views of some embodiments of a method for forming an image sensor including an absorption enhancement structure that comprises a plurality of protrusions disposed along a surface of a substrate, in which the protrusions comprise curved sidewalls.

As illustrated by the cross-sectional view 500 of FIG. 5, a substrate 104 is provided and a first isolation structure 106 is formed on a front-side 104f of the substrate 104. In some embodiments, the substrate 104 may, for example, be a bulk substrate (e.g., a bulk silicon substrate), a silicon-on-insulator (SOI) substrate, or another suitable substrate. It will be appreciated that other materials for the substrate 104 are also within the scope of the disclosure. In some embodiments, before forming the first isolation structure 106, a first implant process is performed to dope the substrate 104 with a first doping type (e.g., p-type). In further embodiments, a process for forming the first isolation structure 106 may include: selectively etching the substrate 104 to form a trench in the substrate 104 that extends into the substrate 104 from the front-side 104f of the substrate 104; and filling (e.g., by chemical vapor deposition (CVD), atomic layer deposition (ALD), physical vapor deposition (PVD), thermal oxidation, etc.) the trench with a dielectric material (e.g., silicon nitride, silicon carbide, silicon dioxide, another suitable dielectric material, or any combination of the foregoing). In further embodiments, the substrate 104 is selectively etched by forming a masking layer (not shown) on the front-side 104f of the substrate 104, and subsequently exposing the substrate 104 to one or more etchants configured to selectively remove unmasked portions of the substrate 104.

Further, as shown in FIG. 5, a photodetector 108 is formed within the substrate 104. In some embodiments, the photodetector 108 includes a region of the substrate 104 comprising a second doping type (e.g., n-type) opposite the first doping type. In some embodiments, the photodetector 108 may be formed by a selective ion implantation process that utilizes a masking layer (not shown) on the front-side 104f of the substrate 104 to selectively implant ions into the substrate. In further embodiments, the first doping type comprises p-type dopants and the second doping type comprises n-type dopants, or vice versa. Subsequently, an interconnect structure 102 is formed along the front-side 104f of the substrate 104. In some embodiments, forming the interconnect structure 102 may includes performing one or more depositions processes, single damascene process(es), dual damascene process(es), other suitable formation process(es), or any combination of the foregoing.

In addition, as illustrated in FIG. 5, after forming the photodetector 108 a thinning process is performed on the back-side 104b of the substrate 104 to reduce an initial thickness Ti of the substrate 104 to a thickness Ts. In some embodiments, the thinning process may include performing a mechanical grinding process, a chemical mechanical polishing (CMP) process, another suitable thinning process, or any combination of the foregoing.

Figure 6:
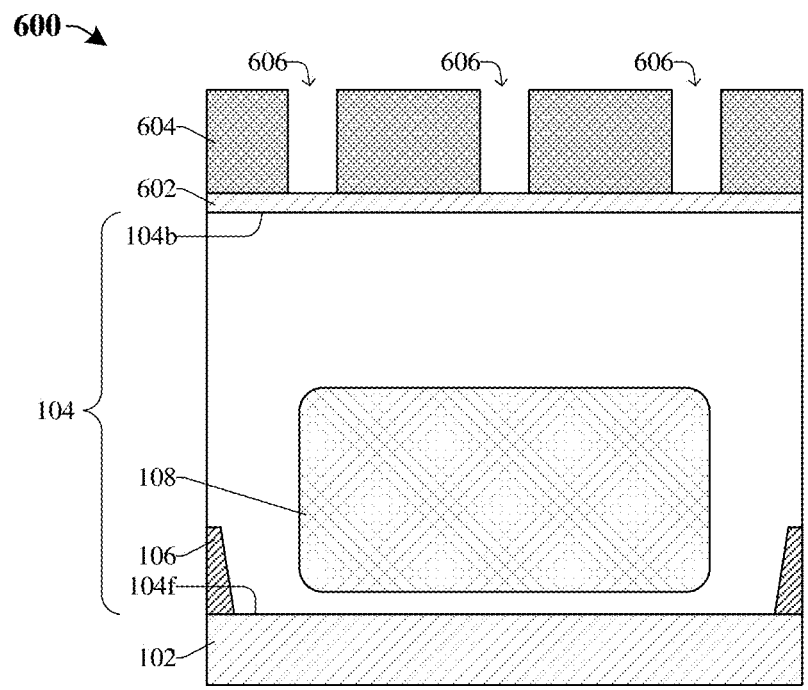

As illustrated by the cross-sectional view 600 of FIG. 6, the structure of FIG. 5 is flipped and subsequently an upper dielectric layer 602 is formed along the back-side 104b of the substrate 104. The upper dielectric layer 602 may be deposited by, for example, CVD, PVD, ALD, or another suitable growth or deposition process. In some embodiments, the upper dielectric layer 602 may, for example, be or comprise an oxide, such as silicon dioxide, another suitable dielectric material, or any combination of the foregoing and/or is formed to a thickness of about 170 Angstroms or within a range of about 150 to 190 Angstroms. It will be appreciated that other values for the thickness of the upper dielectric layer 602 are also within the scope of the disclosure. Further, a masking layer 604 is formed over the upper dielectric layer 602, such that the masking layer 604 comprises a plurality of sidewalls that defines a plurality of openings 606. In some embodiments, the masking layer 604 is deposited by CVD, PVD, ALD, or another suitable growth or deposition process. In yet further embodiments, the masking layer 604 may, for example, be or comprise a hard masking layer, a photoresist, another suitable material, or any combination of the foregoing.

Figure 7:
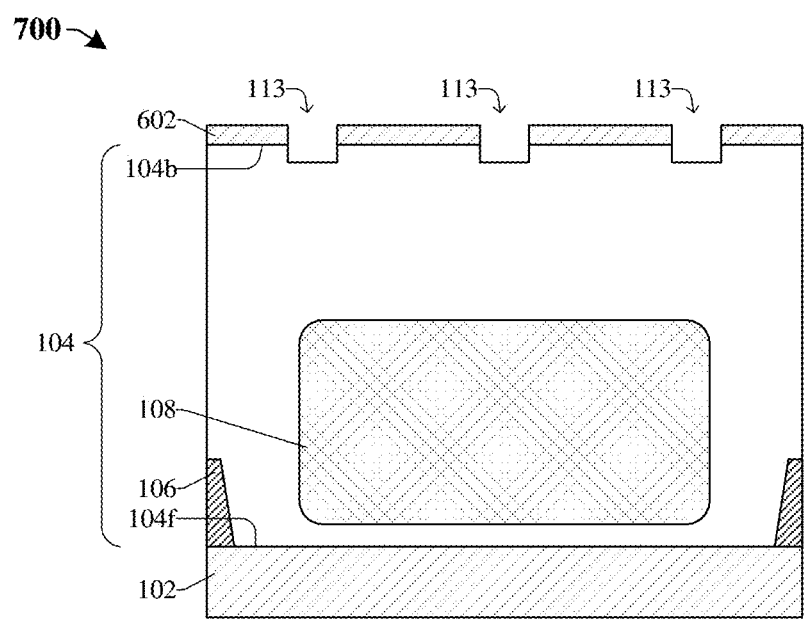

As illustrated by the cross-sectional view 700 of FIG. 7, a first patterning process is performed on the substrate 104 and the upper dielectric layer 602 according to the masking layer (604 of FIG. 6), thereby forming a plurality of recesses 113. The recesses 113 extend into the upper dielectric layer 602 and the back-side 104b of the substrate 104. In some embodiments, the first patterning process may include performing a dry etch process or another suitable etch process. Subsequently, a removal process is preformed to remove the masking layer (604 of FIG. 6). In some embodiments, the removal process includes performing a wet etch process or another suitable removal process. In yet further embodiments, the first patterning process may include performing a chemical dry etch (CDE) drive at a bias voltage that is greater than zero.

Figure 8:
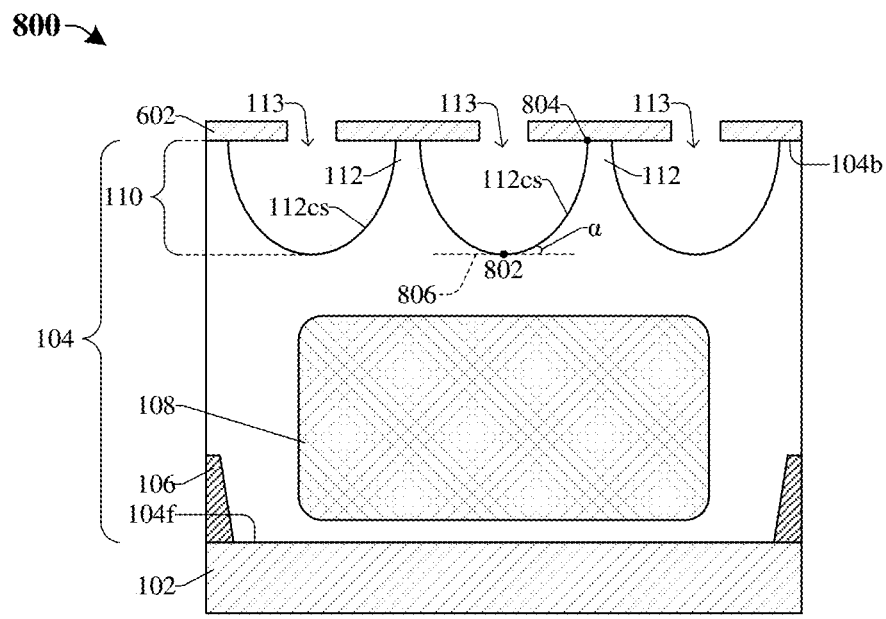

As illustrated by the cross-sectional view 800 of FIG. 8, a second patterning process is performed on the substrate 104, thereby expanding the plurality of recesses 113 and forming a plurality of protrusions 112 along the back-side 104b of the substrate 104. This, in part, forms the absorption enhancement structure 110 along the back-side 104b of the substrate 104. In some embodiments, the second patterning process may include performing an isotropic etch process (e.g., a CDE driven at zero bias voltage), a dry etch process, a plasma etch process, another suitable etch process, or any combination of the foregoing. The second patterning process is performed in such a manner that the protrusions 112 each have opposing curved sidewalls, thereby increasing a light receiving surface area for incident electromagnetic radiation disposed upon the back-side 104b of the substrate 104. Further, in some embodiments, the second patterning process includes exposing the substrate 104 to one or more etchants which may, for example, include sulfur hexafluoride (e.g., $SF_6$), carbon tetrafluoride (e.g., $CF_4$), oxygen (e.g., $O_2$), another suitable etchant, or any combination of the foregoing with zero bias power.

In some embodiments, by virtue of the first and second patterning processes, a curved sidewall 112cs of the protrusions 112 is defined from a first point 802 to a second point 804. In further embodiments, a slope of the curved sidewall 112cs of the protrusions 112 continuously increases while moving along incremental segments of the curved sidewall 112cs from the first point 802 to the second point 804. An angle α defined between the curved sidewall 112cs and a level horizontal line 806 may be, for example, within a range of about 30 to 120 degrees or another suitable value. The level horizontal line 806 may be parallel with the front-side surface 104f of the substrate 104. In yet further embodiments, a reflectivity test process may be performed on the plurality of protrusions 112 to ensure curved sidewalls 112cs of each protrusion 112 are substantially curved (i.e., the slope of each curved sidewall 112cs of the protrusions 112 continuously increases while moving along incremental segments of the curved sidewall 112cs and/or the angle α is within the range of about 30 to 120 degrees or another suitable value). In further embodiments, the reflectivity test process includes disposing incident electromagnetic radiation on the plurality of protrusions 112 and determining a percentage of the incident electromagnetic radiation that is reflected away from the protrusions 112. In yet further embodiments, if the reflectivity is substantially high, then the second patterning process may be repeated or a time of the second patterning process may be increased to ensure the curved sidewalls 112cs of each protrusion 112 are substantially curved.

Figure 9:
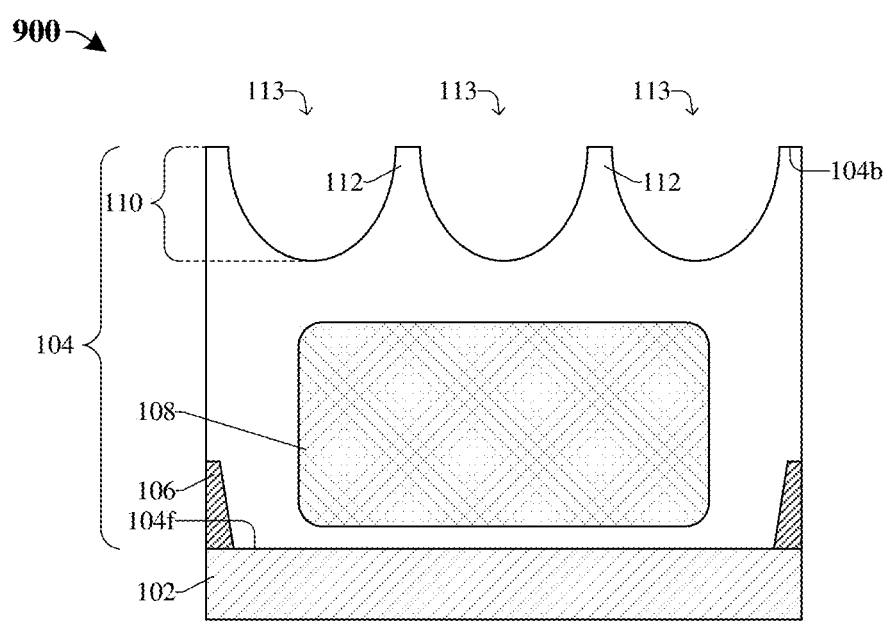

As illustrated by the cross-sectional view 900 of FIG. 9, a removal process is performed to remove the upper dielectric layer (602 of FIG. 8) from along the back-side 104b of the substrate 104. In some embodiments, the removal process may include performing a wet etch process, a dry etch process, another suitable etch process, or any combination of the foregoing. In further embodiments, the removal process includes exposing the upper dielectric layer (602 of FIG. 8) and the substrate 104 to one or more etchants, such as, for example, hydrofluoric acid, dilute hydrofluoric acid, another suitable etchant, or any combination of the foregoing.

Figure 10:
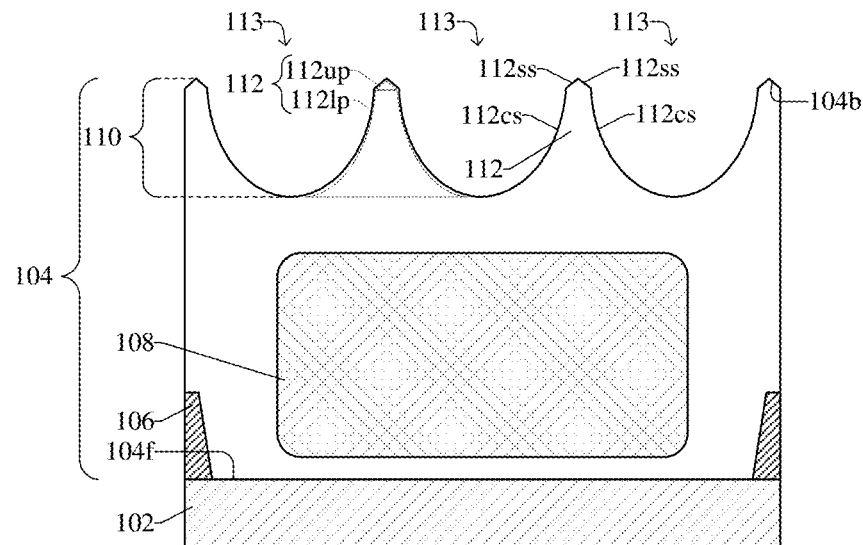

As illustrated by the cross-sectional view 1000 of FIG. 10, a third patterning process is performed on the substrate 104 thereby further expanding the recesses 113. Further, after performing the third patterning process, each protrusions 112 comprises an upper portion 112up overlying a lower portion 112lp. In some embodiments, the upper portion 112up of each protrusion 112 has a rectangular shape or another suitable shape. Thus, each protrusion 112 may have opposing slanted sidewalls 112ss that overlie opposing curved sidewalls 112cs. By virtue of the slanted sidewalls 112ss of the upper portion 112up, a light receiving surface area for incident electromagnetic radiation disposed upon the substrate 104 is increased, thereby increasing the QE of the photodetector 108. In some embodiments, the third patterning process includes performing a wet etch process or another suitable etch process. In further embodiments, the third patterning process includes exposing the substrate 104 to one or more etchants, such as, for example, tetramethylammonium hydroxide (TMAH) or another suitable etchant.

In yet further embodiments, a timing and/or an etchant utilized in the third patterning process are adjusted such that the upper portion of each protrusion 112 has a semicircular shape (not shown) (e.g., see FIG. 3D) or another suitable shape. Thus, an upper surface of each protrusion 112 may be curved, convex (not shown) (e.g., see FIG. 3D), or another suitable shape, thereby increasing a light receiving surface area for incident electromagnetic radiation disposed upon the substrate 104 and increasing the QE of the photodetector 108.

Figure 11:
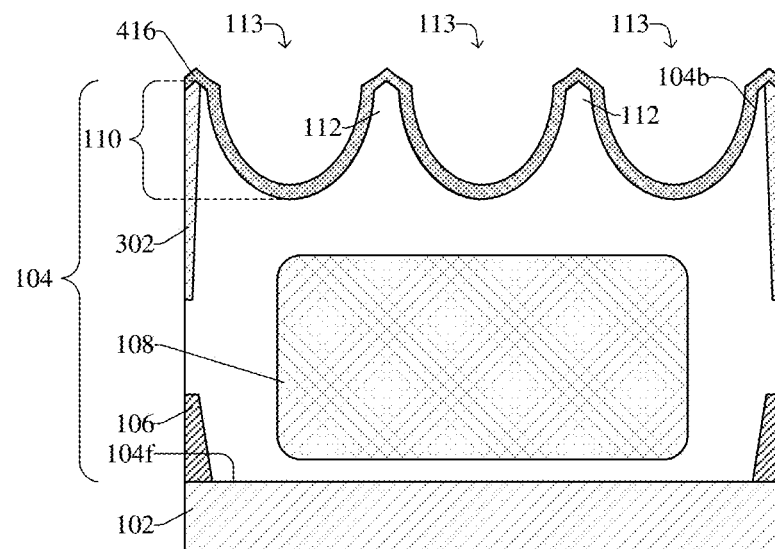

As illustrated by the cross-sectional view 1100 of FIG. 11, a second isolation structure 302 is formed in the substrate 104. In some embodiments, forming the second isolation structure 302 includes: etching the back-side 104b of the substrate 104 to form a DTI opening (not shown) that extends into the back-side 104b of the substrate 104; and depositing (e.g., CVD, PVD, ALD, sputtering, electroless plating, electro plating, or another suitable deposition or growth process) the second isolation structure 302 within the DTI opening. Further, a passivation layer 416 is formed over the back-side 104b of the substrate 104. In some embodiments, the passivation layer 416 is deposited by, for example, PVD, CVD, ALD, thermal oxidation, or another suitable deposition or growth process. In yet further embodiments, the passivation layer 416 is formed within the DTI opening before forming the second isolation structure 302 is deposited, such that the passivation layer 416 is disposed between the second isolation structure 302 and the substrate 104 (e.g., see FIG. 4A). The second isolation structure 302 may be configured as a DTI structure, a back-side deep trench isolation (BDTI) structure, or another suitable isolation structure. In some embodiments, the second isolation structure 302 may, for example, be or comprise a dielectric material such as silicon nitride, silicon carbide, silicon dioxide, silicon oxycarbide, silicon oxynitride, another suitable dielectric material, a metal material such as copper, aluminum, tungsten, another suitable metal material, or any combination of the foregoing.

Figure 12:
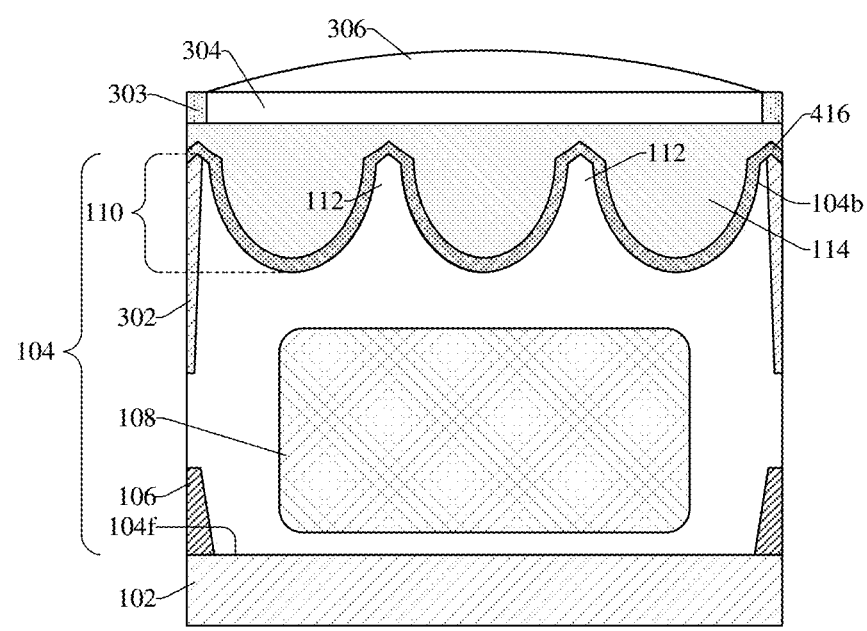

As illustrated by the cross-sectional view 1200 of FIG. 12, an upper dielectric structure 114 is formed over the passivation layer 416. In some embodiments, a process for forming the upper dielectric structure 114 includes: depositing (e.g., by CVD, PVD, ALD, thermal oxidation, etc.) a dielectric material over the passivation layer 416; and performing a planarization process (e.g., a chemical mechanical polishing (CMP) process) into the dielectric material, thereby forming the upper dielectric structure 114 such that an upper surface of the upper dielectric structure 114 is substantially flat (e.g., within a tolerance of a CMP process). In some embodiments, a grid structure 303 is formed over the upper dielectric structure 114 and a color filter 304 is formed over the upper dielectric structure 114 and between sidewalls of the grid structure 303. In further embodiments, a micro-lens 306 is formed over the color filter 304 such that the micro-lens 306 has a convex upper surface. In further embodiments, the grid structure 303, the color filter 304, and/or the micro-lens 306 may, for example, respectively be deposited by CVD, PVD, ALD, sputtering, electroless plating, electro plating, or another suitable deposition or growth process.

Figure 13:
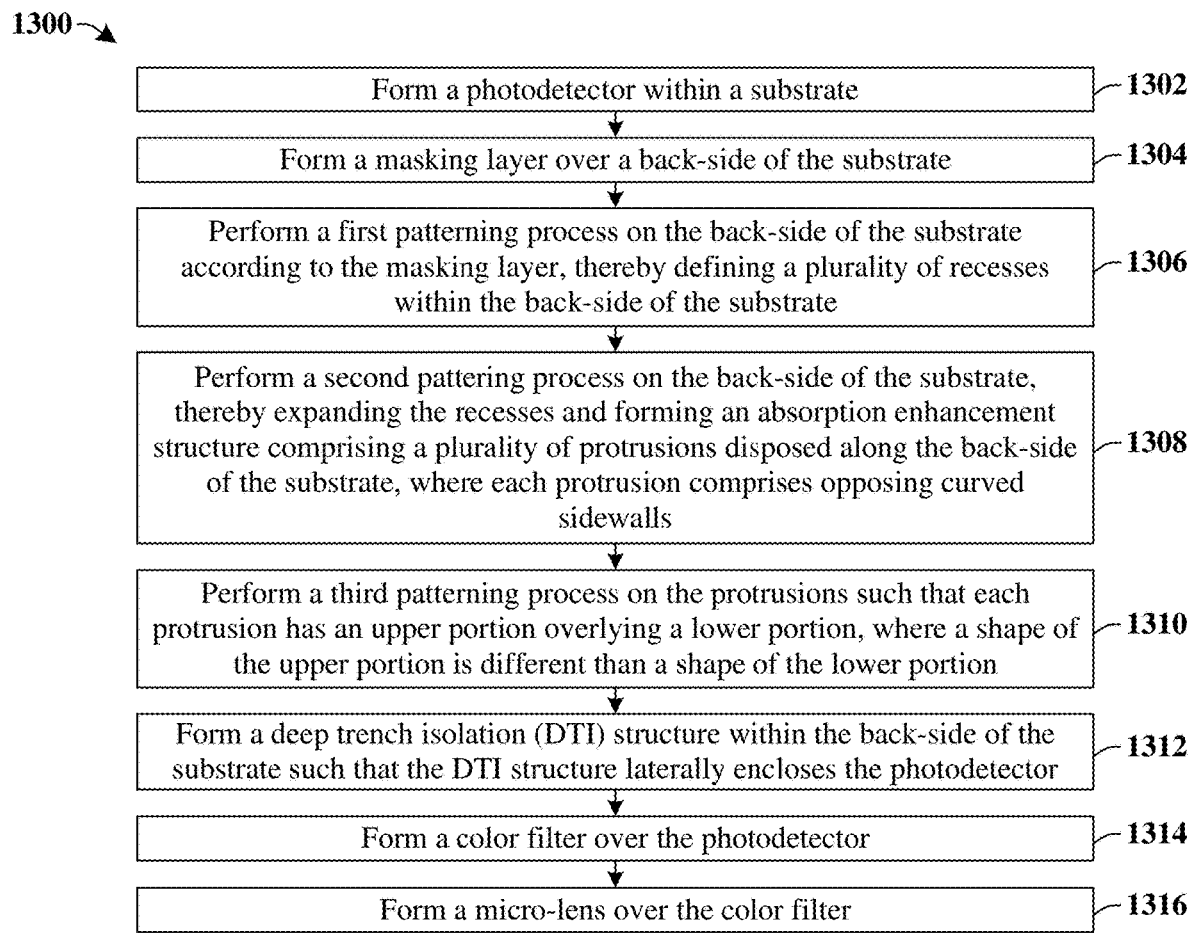
FIG. 13 illustrates a method in flow chart format that illustrates some embodiments for forming an image sensor including an absorption enhancement structure that comprises a plurality of protrusions disposed along a surface of a substrate, in which the protrusions comprise curved sidewalls.

FIG. 13 illustrates a method 1300 for forming an image sensor comprising an absorption enhancement structure including a plurality of protrusions disposed along a surface of a substrate according to the present disclosure. Although the method 1300 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1302, a photodetector is formed within a substrate. FIG. 5 illustrates a cross-sectional view 500 corresponding to some embodiments of act 1302.

At act 1304, a masking layer is formed over a back-side of the substrate. FIG. 6 illustrates a cross-sectional view 600 corresponding to some embodiments of act 1304.

At act 1306, a first patterning process is performed on the back-side of the substrate according to the masking layer, thereby defining a plurality of recesses within the back-side of the substrate. FIG. 7 illustrates a cross-sectional view 700 corresponding to some embodiments of act 1306.

At act 1308, a second patterning process is performed on the back-side of the substrate, thereby expanding the recesses and forming an absorption enhancement structure comprising a plurality of protrusions disposed along the back-side of the substrate. Each protrusion comprises opposing curved sidewalls. FIG. 8 illustrates a cross-sectional view 800 corresponding to some embodiments of act 1308.

At act 1310, a third patterning process is performed on the protrusions such that each protrusion has an upper portion overlying a lower portion, where a shape of the upper portion is different than a shape of the lower portion. FIG. 10 illustrates a cross-sectional view 1000 corresponding to some embodiments of act 1310.

At act 1312, a deep trench isolation (DTI) structure is formed within the back-side of the substrate such that the DTI structure laterally encloses the photodetector. FIG. 11 illustrates a cross-sectional view 1100 corresponding to some embodiments of act 1312.

At act 1314, a color filter is formed over the photodetector. FIG. 12 illustrates a cross-sectional view 1200 corresponding to some embodiments of act 1314.

At act 1316, a micro-lens is formed over the color filter. FIG. 12 illustrates a cross-sectional view 1200 corresponding to some embodiments of act 1316.

Accordingly, in some embodiments, the present disclosure relates to an image sensor including an absorption enhancement structure comprising a plurality of protrusions disposed along a surface of a substrate, in which each protrusion comprises opposing curved sidewalls.

In some embodiments, the present application provides an image sensor, including: a substrate comprising a front-side surface and a back-side surface; a photodetector disposed within the substrate; and an absorption enhancement structure disposed along the back-side surface of the substrate and overlying the photodetector, wherein the absorption enhancement structure includes a plurality of protrusions extending outwardly from the back-side surface of the substrate, and wherein each protrusion has opposing curved sidewalls.

In some embodiments, the present application provides an integrated chip, including: a substrate having a front-side surface and a back-side surface; an interconnect structure disposed along the front-side of the substrate; a photodetector disposed within the substrate; an absorption enhancement structure disposed along the back-side surface of the substrate, wherein the absorption enhancement structure includes a plurality of first protrusions and a corresponding plurality of recesses in the back-side surface that engagedly meet the first protrusions, wherein each first protrusion comprises opposing curved sidewalls; and an upper dielectric structure overlying the back-side surface of the substrate, wherein the upper dielectric structure includes a plurality of second protrusions disposed along a lower surface of the upper dielectric structure, wherein each second protrusion has a convex lower surface and fills a corresponding recess in the plurality of recesses, wherein an index of refraction of the upper dielectric structure is less than an index of refraction of the substrate.

In some embodiments, the present application provides a method for forming an image sensor, the method includes: performing an ion implant process to form a photodetector within a substrate; depositing a dielectric layer over a back-side surface of the substrate; forming a masking layer over the dielectric layer, wherein the masking layer includes a plurality of sidewalls defining a first plurality of openings that exposes an upper surface of the dielectric layer; performing a first patterning process on the dielectric layer and the substrate to form a plurality of recesses within the substrate; and performing a second patterning process on the substrate, thereby expanding the recesses and forming an absorption enhancement structure along the back-side surface of the substrate, wherein the absorption enhancement structure includes a plurality of protrusions that each have curved opposing sidewalls.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor, comprising:
   a substrate comprising a front-side surface and a back-side surface;
   a photodetector disposed within the substrate; and
   an absorption enhancement structure disposed along the back-side surface of the substrate and overlying the photodetector, wherein the absorption enhancement structure comprises a plurality of protrusions extending outwardly from the back-side surface of the substrate, and wherein each protrusion comprises slanted straight sidewalls overlying opposing curved sidewalls.

2. The image sensor of claim 1, further comprising:
   an upper dielectric structure overlying the absorption enhancement structure, wherein the upper dielectric structure comprises a plurality of convex protrusions disposed along a bottom surface of the upper dielectric structure, wherein each convex protrusion is spaced laterally between adjacent protrusions of the absorption enhancement structure.

3. The image sensor of claim 1, wherein a width of each protrusion continuously increases at a first rate from a top of the protrusion to a first point below the top of the protrusion and continuously increases at a second rate from the first point towards a bottom of the protrusion, wherein the first rate is greater than the second rate.

4. The image sensor of claim 1, wherein the slanted straight sidewalls meet at a point defining a top of the protrusions.

5. The image sensor of claim 1, further comprising:
a deep trench isolation (DTI) structure disposed within the substrate, wherein the DTI structure extends from the back-side surface of the substrate to a point below an upper surface of the photodetector, wherein the DTI structure laterally encloses the photodetector.

6. The image sensor of claim 1, further comprising:
an interconnect structure disposed along the front-side surface of the substrate, wherein the interconnect structure comprises an interconnect dielectric structure, a plurality of conductive vias, and a plurality of conductive wires.

7. The image sensor of claim 1, further comprising:
a color filter overlying the absorption enhancement structure, wherein the color filter is configured to pass a first range of wavelengths while blocking a second range of wavelengths different from the first range of wavelengths; and
a micro-lens overlying the color filter and comprising a convex upper surface.

8. An integrated chip, comprising:
a substrate comprising a front-side surface and a back-side surface;
an interconnect structure disposed along the front-side surface of the substrate;
a photodetector disposed within the substrate;
an absorption enhancement structure disposed along the back-side surface of the substrate, wherein the absorption enhancement structure comprises a plurality of first protrusions and a corresponding plurality of recesses in the back-side surface that engagedly meet the first protrusions, wherein each first protrusion comprises slanted straight opposing sidewalls overlying opposing curved sidewalls; and
an upper dielectric structure overlying the back-side surface of the substrate, wherein the upper dielectric structure comprises a plurality of second protrusions disposed along a lower surface of the upper dielectric structure, wherein each second protrusion comprises a convex lower surface and fills a corresponding recess in the plurality of recesses, wherein an index of refraction of the upper dielectric structure is less than an index of refraction of the substrate.

9. The integrated chip of claim 8, further comprising:
a grid structure overlying the back-side surface of the substrate, wherein the photodetector is spaced laterally between sidewalls of the grid structure.

10. An integrated chip, comprising:
a substrate having a front-side surface opposite a back-side surface;
a photodetector disposed within the substrate;
an isolation structure extending into the back-side surface of the substrate, wherein the photodetector is spaced between opposing sidewalls of the isolation structure; and
an upper dielectric structure disposed over the substrate, wherein the upper dielectric structure comprises a plurality of first protrusions that extends into the back-side surface of the substrate, wherein the first protrusions are spaced laterally between the opposing sidewalls of the isolation structure, wherein the first protrusions respectively comprise a curved lower surface that is disposed below the back-side surface of the substrate, wherein a top surface of the upper dielectric structure is substantially flat.

11. The integrated chip of claim 10, wherein the first protrusions respectively comprise a straight sidewall above the curved lower surface.

12. The integrated chip of claim 11, wherein a height of the curved lower surface is greater than a height of the straight sidewall.

13. The integrated chip of claim 10, further comprising:
a grid structure on the back-side surface of the substrate, wherein the photodetector is spaced between opposing sidewalls of the grid structure, and wherein a top surface of the grid structure is aligned with the top surface of the upper dielectric structure.

14. The integrated chip of claim 13, wherein a height of the grid structure is less than a height of the first protrusions.

15. The image sensor of claim 2, wherein a top surface of the upper dielectric structure is substantially flat.

16. The image sensor of claim 2, a height of the plurality of convex protrusions is greater than a distance between a top surface of the absorption enhancement structure and a top surface of the upper dielectric structure.

17. The integrated chip of claim 8, further comprising:
a deep trench isolation (DTI) structure extending from the back-side surface of the substrate to a point below the back-side surface of the substrate, wherein the plurality of first protrusions and the photodetector are spaced between opposing sidewalls of the DTI structure.

18. The integrated chip of claim 17, wherein a segment of the DTI structure abuts a first slanted straight sidewall of an individual protrusion in the plurality of first protrusions.

19. The integrated chip of claim 17, further comprising:
a shallow trench isolation (STI) structure extending from the front-side surface of the substrate towards the DTI structure, wherein a height of the plurality of first protrusions is greater than a height of the STI structure.

20. The integrated chip of claim 17, wherein a maximum width of a segment of the DTI structure is less than a maximum width of an individual protrusion in the plurality of first protrusions.

* * * * *